US006844580B2

(12) United States Patent
Rhodes

(10) Patent No.: US 6,844,580 B2
(45) Date of Patent: Jan. 18, 2005

(54) CMOS IMAGER WITH A SELF-ALIGNED BURIED CONTACT

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/361,710

(22) Filed: Feb. 11, 2003

(65) Prior Publication Data

US 2003/0148570 A1 Aug. 7, 2003

Related U.S. Application Data

(60) Continuation of application No. 10/278,792, filed on Oct. 24, 2002, which is a continuation of application No. 09/715,076, filed on Nov. 20, 2000, now Pat. No. 6,495,434, which is a division of application No. 09/335,775, filed on Jun. 18, 1999, now Pat. No. 6,326,652.

(51) Int. Cl.[7] ................... H01L 31/062; H01L 31/113
(52) U.S. Cl. .................................................. 257/291
(58) Field of Search ....................... 257/291, 231, 257/232, 233, 234, 292, 293, 288, 910

(56) References Cited

U.S. PATENT DOCUMENTS

| 4,262,297 | A |   | 4/1981  | Partridge |
|-----------|---|---|---------|-----------|
| 4,309,624 | A |   | 1/1982  | Hynecek et al. |
| 4,319,261 | A |   | 3/1982  | Kub |
| 4,374,700 | A |   | 2/1983  | Scott et al. |
| 4,700,459 | A |   | 10/1987 | Peek |
| 5,151,385 | A |   | 9/1992  | Yamamoto et al. |
| 5,319,604 | A |   | 6/1994  | Imondi et al. |
| 5,338,700 | A | * | 8/1994  | Dennison et al. ........... 438/579 |
| 5,393,997 | A |   | 2/1995  | Fukusho et al. |
| 5,461,425 | A |   | 10/1995 | Fowler et al. |
| 5,471,515 | A | * | 11/1995 | Fossum et al. ............... 337/60 |
| 5,506,429 | A |   | 4/1996  | Tanaka et al. |
| 5,541,402 | A |   | 7/1996  | Ackland et al. |
| 5,576,763 | A |   | 11/1996 | Ackland et al. |
| 5,608,243 | A |   | 3/1997  | Chi et al. |
| 5,612,799 | A |   | 3/1997  | Yamazaki et al. |
| 5,614,744 | A |   | 3/1997  | Merrill |
| 5,625,210 | A |   | 4/1997  | Lee et al. |
| 5,705,846 | A |   | 1/1998  | Merrill |
| 5,708,263 | A | * | 1/1998  | Wong ...................... 250/208.1 |
| 5,747,840 | A |   | 5/1998  | Merrill |
| 5,757,045 | A | * | 5/1998  | Tsai et al. ................... 257/336 |
| 5,760,458 | A |   | 6/1998  | Bergemont et al. |
| 6,326,652 | B1| * | 12/2001 | Rhodes ....................... 257/231 |
| 6,495,434 | B1| * | 12/2002 | Rhodes ....................... 438/579 |

OTHER PUBLICATIONS

Dickinson, A., et al., "A 256×256 CMOS Active Pixel Image Sensor with Motion Detection," 1995 IEEE International Solid–State Circuits Conference, pp. 226–227.

(List continued on next page.)

Primary Examiner—David Nhu
(74) Attorney, Agent, or Firm—Dickstein Shapiro Morin & Oshinsky LLP

(57) ABSTRACT

An imaging device formed as a CMOS semiconductor integrated circuit includes a buried contact line between the floating diffusion region and the gate of a source follower output transistor. The self-aligned buried contact in the CMOS imager decreases leakage from the diffusion region into the substrate which may occur with other techniques for interconnecting the diffusion region with the source follower transistor gate. Additionally, the self-aligned buried contact is optimally formed between the floating diffusion region and the source follower transistor gate which allows the source follower transistor to be placed closer to the floating diffusion region, thereby allowing a greater photo detection region in the same sized imager circuit.

102 Claims, 9 Drawing Sheets

OTHER PUBLICATIONS

Dickinson, A., et al., "Standard CMOS Active Pixel Image Sensors for Multimedia Applications," Proceedings of Sixteenth Conference on Advanced Research in VLSI, Mar. 27–29, 1995, pp. 214–224.

Eid, E–S., et al., "A 256 × 256 CMOS Active Pixel Image Sensor," Proc. SPIE vol. 2415, Apr. 1995, pp. 265–275.

Fossum, E., "CMOS Image Sensors: Electronic Camera On A Chip," 1995 IEEE, pp. 17–25.

Fossum, E., et al., "IEDM A 37×28mm$^2$ 600k–Pixel CMOS APS Dental X–Ray Camera–on–a–Chip with Self–Triggered Readout," 1998 IEEE International Solid–State Circuits Conference, pp. 172–173.

Fossum, E., "Low Power Camera–on–a–Chip Using CMOS Active Pixel Sensor Technology," 1995 IEEE, pp. 74–77.

Fossum, E., "Architectures for focal plane image processing," Optical Engineering, vol. 28, No. 8, Aug. 1989, pp. 865–871.

Janesick, J., et al., "New advancements in charge–coupled device technology—sub–electron noise and 4096×4096 pixel CCDs," Proc. SPIE vol. 1242, 1990, pp. 223–237.

Kemeny, S.E., et al., "Update on focal–plane image processing research," Proc. SPIE vol. 1447, 1991, pp. 243–250.

Mendis, S., et al., "CMOS Active Pixel Image Sensor," IEEE Transactions on Electron Devices, vol. 41, No. 3, Mar. 1994, pp. 452–453.

Mendis, S.K., et al., "A 128 × 128 CMOS Active Pixel Image Sensor for Highly Integrated Imaging Systems," 1993 IEEE, pp. 583–586.

Mendis, S.K., et al., "CMOS Active Pixel Image Sensors for Highly Integrated Imaging Systems," IEEE Journal of Solid–State Circuits, vol. 32, No. 2, Feb. 1997, pp. 187–197.

Mendis, S.K., et al., "Design of a Low–Light–Level Image Sensor with On–Chip Sigma–Delta Analog–to–Digital Conversion," Proc. SPIE vol. 1900, Jul. 1993, pp. 31–39.

Mendis, S.K., et al., "Low–Light–Level Image Sensor with On–Chip Signal Processing," Proc. SPIE vol. 1952, Nov. 1993, pp. 23–33.

Mendis, S.K., et al., "Progress In CMOS Active Pixel Image Sensors," Proc. SPIE vol. 2172, May 1994, pps. 19–29.

Nakamura, J., et al., "CMOS Active Pixel Image Sensor with Simple Floating Gate Pixels," IEEE Transactions on Electron Devices, vol. 42, No. 9, Sep. 1995, pp. 1693–1694.

Nixon, R.H., et al., "256 ×256 CMOS Active Pixel Sensor Camera–on–a–Chip," IEEE Journal of Solid–State Circuits, vol. 31, No. 12, Dec. 1996, pp. 2046–2050.

Nixon, R.H., et al., "256×256 CMOS Active Pixel Sensor Camera–on–a–Chip," 1996 IEEE International Solid–State Circuits Conference, pps. 178–179.

Panicacci, R., et al., "Programmable multiresolution CMOS active pixel sensor," Proc. SPIE vol. 2654, Mar. 1996, pp. 72–79.

Panicacci, R.A., et al., "128Mb/s Multiport CMOS Binary Active–Pixel Image Sensor," 1996 IEEE International Solid–State Circuit Conference, pp. 100–101.

Yadid–Pecht, O., et al., "CMOS Active Pixel Sensor Star Tracker with Regional Electronic Shutter," IEEE Journal of Solid–State Circuits, vol. 32, No. 2, Feb. 1997, pp. 285–288.

Yadid–Pecht, O., et al., "Wide dynamic range APS star tracker," Proc. SPIE vol. 2654, Mar. 1996, pp. 82–92.

Zarnowski, J., et al., "Imaging options expand with CMOS technology," Laser Focus World, Jun. 1997, pp. 125–130.

Zhou, Z., et al., "A Cmos Imager with On–Chip Variable Resolution for Light–Adaptive Imaging," 1998 IEEE International Solid–State Circuits Conference, pp. 174–175.

Zhou, Z., et al., "A Digital CMOS Active Pixel Image Sensor For Multimedia Applications," Proc. SPIE vol. 2894, Sep. 1996, pp. 282–288.

* cited by examiner

CMOS IMAGER WITH A SELF-ALIGNED BURIED CONTACT

CROSS-REFERENCE TO RELATED APPLICATIONS

This application a continuation of application U.S. patent application Ser. No. 10/278,792, filed Oct. 24, 2002, which is a continuation application of U.S. patent application Ser. No. 09/715,076, filed Nov. 20, 2000, now U.S. Pat. No. 6,495,434 which is a divisional application of U.S. patent application Ser. No. 09/335,775 filed Jun. 18, 1999, which matured into U.S. Pat. No. 6,326,652, issued Dec. 4, 2001, the entirety of each of which is incorporated herein by reference.

FIELD OF THE INVENTION

The invention relates generally to improved semiconductor imaging devices and in particular to a silicon imaging device which can be fabricated using a standard CMOS process. Particularly, the invention relates to a CMOS imager having a self-aligned buried contact formed between a pair of transistor gates or a transistor gate and an isolation region.

DISCUSSION OF RELATED ART

There are a number of different types of semiconductor-based imagers, including charge coupled devices (CCDs), photodiode arrays, charge injection devices and hybrid focal plane arrays. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there have been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel during charge transfer which also results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, a photodiode, or a photoconductor overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photodiode, or the photoconductor having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate or a photoconductor. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046–2050, 1996; Mendis et al, "CMOS Active Pixel Image Sensors," IEEE Transactions on Electron Devices, Vol. 41(3) pp. 452–453, 1994 as well as U.S. Pat. No. 5,708,263 and U.S. Pat. No. 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, and GaAs. Typically the entire substrate 16 is p-type doped silicon substrate and may contain a surface p-well 20 (with layer 18 omitted), but many other options are possible, such as, for example p on p− substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below. A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source VDD. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source VDD and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source VSS. Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages VOUTR and VOUTS of the readout circuit 60. These voltages are then subtracted (VOUTS-VOUTR) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in the manner shown by element 14 of FIG. 1. FIG. 4 shows a 2×2 portion of pixel array 200. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of photodetector circuit 14 of the FIG. 1 CMOS imager. The photogate signal PG is nominally set to 5V and the reset signal RST is nominally set at 2.5V. As can be seen from the figure, the process is begun at time $t_0$ by briefly pulsing reset voltage RST to 5V. The RST voltage, which is applied to the gate 32 of reset transistor 31, causes transistor 31 to turn on and the floating diffusion node 30 to charge to the VDD voltage present at n+ region 34 (less the voltage drop Vth of transistor 31). This resets the floating diffusion node 30 to a predetermined voltage (VDD-Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26. A transfer gate voltage pulse TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be understood that CMOS imagers may dispense with the transistor gate 28 and associated transistor 29 or retain these structures while biasing the transfer transistor gate 28 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip, IEDM Vol. 95 pages 17–25 (1995) as well as other publications. These references are incorporated herein by reference.

Prior CMOS imagers suffer from several drawbacks regarding the charge flow and contact between different regions of the substrate, such as, for example the floating diffusion area 30 and the source follower transistor 36. For example, during etching to create the contact between the floating diffusion region 30 and the source follower transistor 36 caution must be taken to avoid over etching into the shallow n-doped region of the floating diffusion region so as to prevent potential charge leakage into the substrate during operation of the imager. Since the size of the pixel electrical signal is very small due to the collection of photons in the photo array, the signal to noise ratio of the pixel should be as high as possible within a pixel. Thus, leakage into the substrate is a significant problem to be avoided in CMOS imagers.

Additionally, the tungsten metal, which is typically used to contact the different regions of the CMOS imager, is deposited with tungsten fluoride and a reaction sometimes takes place between the tungsten fluoride and the substrate resulting in the formation of silicon fluoride which creates worm holes in the substrate. These worm holes create a conductive channel for current to leak into the substrate, creating a poor performance for the imager. Also, conventional contact regions typically include a highly n-doped region to facilitate an ohmic metal-semiconductor contact between the contact metallization and the underlying n-doped silicon region to achieve charge transfer. However, this same highly doped n+ region 30 creates current leakage into the substrate due to high electric fields caused by the abrupt junction. Also, typically there must be an over etch of the contact to account for non-uniformities across the wafer and non-uniformity of the BPSG thickness.

Examples of the above-described drawbacks can be seen from FIGS. 5–7 which show a side view of several CMOS imagers of the prior art and describe the floating diffusion and source follower transistor gate contact. It should be understood that these drawbacks are also present where a metal contact is required to electrically connect the CMOS imagers of the prior art. It should be understood that similar reference numbers correspond to similar elements for FIGS. 5–7.

Reference is now made to FIG. 5. This figure shows the region between the floating diffusion and the source follower transistor of a prior CMOS imager having a photogate as the photoactive area and further includes a transfer gate. The imager 100 is provided with three doped regions 143, 126 and 115, which are doped to a conductivity type different from that of the substrate, for exemplary purposes regions 143, 126 and 115 are treated as n type, which are within a p-well of a substrate. The first doped region 143 is the photosite charge collector, and it underlies a portion of the photogate 142, which is a thin layer of material transparent or partially transparent to radiant energy, such as polysilicon. The first doped region 143 is typically an n-doped region. An insulating layer 140 of silicon dioxide, silicon nitride, or other suitable material is formed over a surface of the doped layer 143 of the substrate between the photogate 142 and first doped region 143.

The second doped region 126 transfers charge collected by the photogate 142 and it serves as the source for the transfer transistor 128. The transfer transistor 128 includes a transfer gate 139 formed over a gate oxide layer 140. The transfer gate 139 has insulating spacers 149 formed on its sides.

The third doped region 115 is the floating diffusion region and is connected to a gate 136 of a source follower transistor by contact lines 125, 127, 129 which are typically metal contact lines as described in more detail below. The imager 100 typically includes a highly n+ doped region 120 within n-doped region 115 under the floating diffusion region contact 125 which provides good ohmic contact of the contact 125 with the n-doped region 115. The floating diffusion contact 125 connects n+ region 120 of the floating diffusion region with the gate 136 of the source follower transistor. In other embodiments of the prior art, the entire region 115 may be doped n+ thereby eliminating the need for n+ region 120.

The source and drain regions of the source follower transistor are not seen in FIG. 5 as they are perpendicular to the page but are on either side of gate 136. The source follower gate 136 is usually formed of a doped polysilicon which may be silicided and which is deposited over a gate oxide 140, such as silicon dioxide. The floating diffusion contact 125 is usually formed of a tungsten plug typically a Ti/TiN/W metallization stack as described in further detail below. The floating diffusion contact 125 is formed in an insulating layer 135 which is typically an undoped oxide followed by the deposition of a doped oxide such as a BPSG layer deposited over the substrate. The tungsten metal which forms the floating diffusion/source follower contact 125 is typically deposited using a tungsten fluoride such as $WF_6$.

Typically, the layer 135 must be etched with a selective dry etch process prior to depositing the tungsten plug connector 125. The imager 100 also includes a source follower contact 127 formed in layer 135 in a similar fashion to floating diffusion contact 125. Source follower contact 127 is also usually formed of a tungsten plug typically a Ti/TiN/W metallization stack as described in further detail below. The floating diffusion contact 125 and the source follower contact 127 are connected by a metal layer 129 formed over layer 135. Typically metal layer 129 is formed of aluminum, copper or any other metal.

Separating the source follower transistor gate 136 and the floating diffusion region 115 is a field oxide layer 132, which serves to surround and isolate the cells. The field oxide 132 may be formed by thermal oxidation of the substrate or in the Local Oxidation of Silicon (LOCOS) or by the Shallow Trench Isolation (STI) process which involves the chemical vapor deposition of an oxide material.

It should be understood that while FIG. 5 shows an imager having a photogate as the photoactive area and additionally includes a transfer transistor, additional imager structures are also well known. For example, CMOS imagers having a photodiode or a photoconductor as the photoactive area are known. Additionally, while a transfer transistor has some advantages as described above, it is not required.

The prior art metal contacts 125, 127 described with reference to FIG. 5 typically include a thin layer 123 formed of titanium, titanium nitride or a mixture thereof formed in the etched space in the layer 135. A tungsten plug 122 is then filled in the etched space in the layer 135 inside the thin layer 123. The contact 125 contacts n+ region 120 and forms a $TiSi_2$ area 121 by a reaction between the titanium from layer 123 with the silicon substrate in n+ region 120.

Reference is now made to FIG. 6. This figure illustrates a partially cut away side view of a semiconductor imager undergoing a processing method according to the prior art. The imager 104 has the floating diffusion region 115 having an n+ doped region 120 and the source follower transistor gate 136 already formed therein. The floating diffusion 115 and the source follower gate 136 are under layer 135, which, as noted, is preferably composed of oxides, typically a layered structure of an undoped and doped, i.e., BPSG, oxides. A resist 155 is applied to layer 135 in order to etch through layer 135 to form the contacts to the floating diffusion region 115 and the source follower transistor gate 136. Layer 135 is then etched to form the hole 156 in layer 135 for the floating diffusion contact 125 and hole 157 in layer 135 for the source follower transistor contact 127 as shown in FIG. 7. However, as can be seen from FIG. 7, since the field oxide 132 and layer 135 are both similar oxides it is difficult to control the etching process when attempting to align the hole 156 with the edge of the field oxide 132. In fact, the etching process often etches deep into the n+ region 120 or etches through the exposed edge of the field oxide 132 causing charge leakage to the substrate as shown by the arrows in FIG. 7. Etching deep into the n+ region 120 results in poor contact resistance to the n+ region 120. Etching through the n+ region 120 or through the exposed region of the filed oxide 132 can result in charge leakage to the substrate.

The devices described with reference to FIGS. 5–7 have several drawbacks. For example, during etching, caution must be taken to avoid etching through the n+ layer 120 or even deep into n-doped region 115 where the n-type dopant concentration is reduced. Additionally, when the tungsten metal is deposited by the tungsten fluoride, a reaction sometimes takes place between the tungsten fluoride and the substrate resulting in the formation of silicon fluoride which creates worm holes through the n+ region 120 and into the substrate. These worm holes may create a channel for current to leak into the substrate, creating a poor performance for the imager. While Ti/TiN barrier layers are deposited to form a good ohmic contact to the n+ region due to the TiSi2 reaction and provide a TiN barrier between the W metallization and the Si substrate, worm holes and contact leakage still occur. Also, the prior art floating diffusion region 115 included the highly n+ region 120 to provide an ohmic contact; however, this same highly doped n+ region sets up high electric fields with respect to the p-type region under field oxide region 132 which fosters current leakage into the substrate. Accordingly, a better contact which provides a good ohmic contact, while avoiding substrate leakage is needed.

SUMMARY OF THE INVENTION

The present invention provides a CMOS imager having a self-aligned contact. In a preferred implementation, the self-aligned contact is between the floating diffusion region and the gate of the source follower transistor. The self-aligned contact provides a better ohmic contact with less chance of leakage into the substrate. The self-aligned contact allows the electrical connection of the device without the possibility of etching into the substrate, and thereby causing leakage, while providing a sufficient ohmic contact. The self-aligned contact also allows the imager components to be placed closer together, thereby reducing the size of a pixel and allowing an increased photoarea per cell size which, it turn, increases the signal to noise ratio of the imager. In addition, the problems with worm holes and connecting of the floating diffusion contact are completely avoided as there is no need for the highly doped n+ region 120 in the present invention and additionally no need for any metallization to be directly in contact with the silicon substrate.

The above and other advantages and features of the invention will be more clearly understood from the following detailed description which is provided in connection with the accompanying drawings.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

Figure 1:
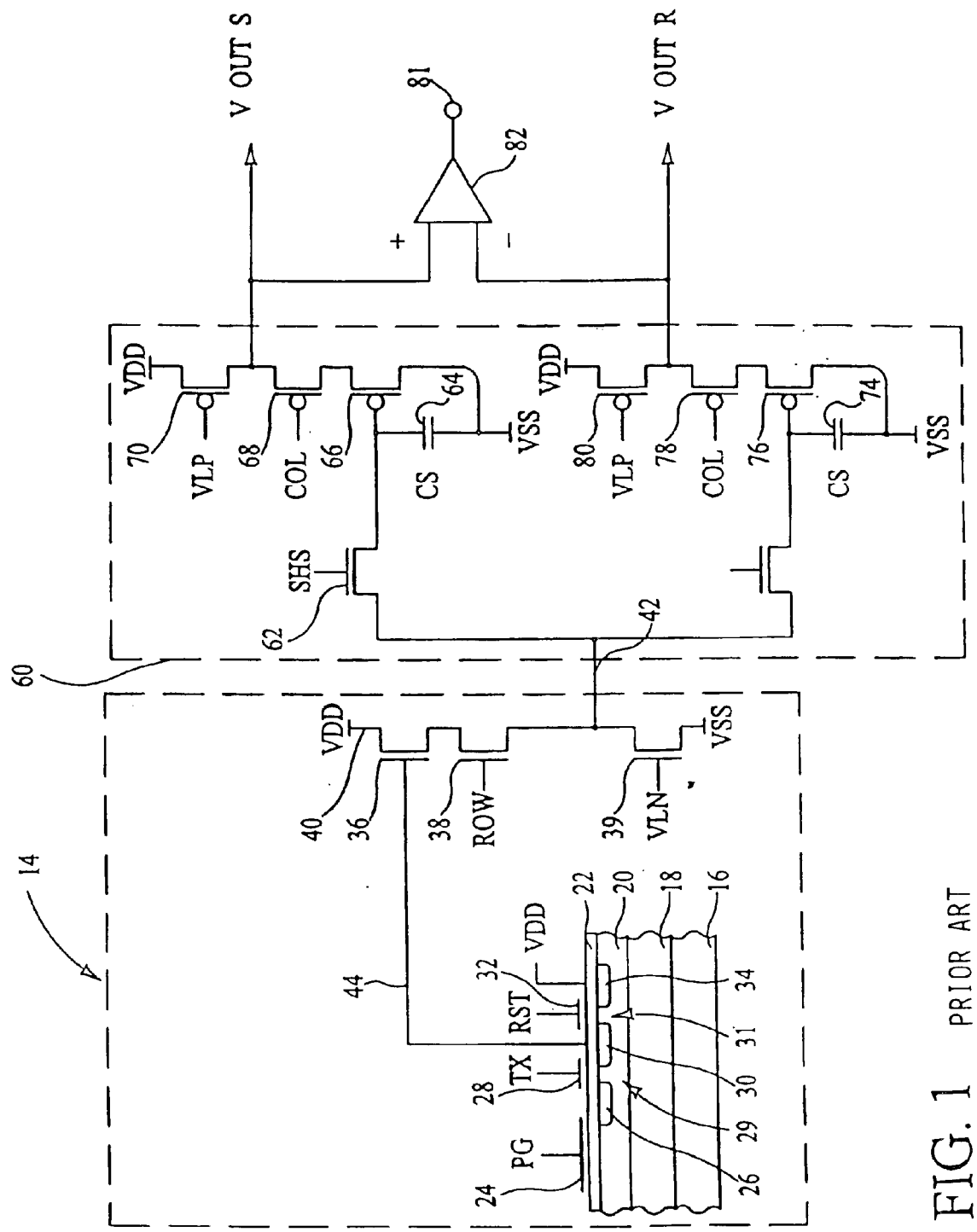
FIG. 1 is a representative circuit of a CMOS imager.
Figure 2:
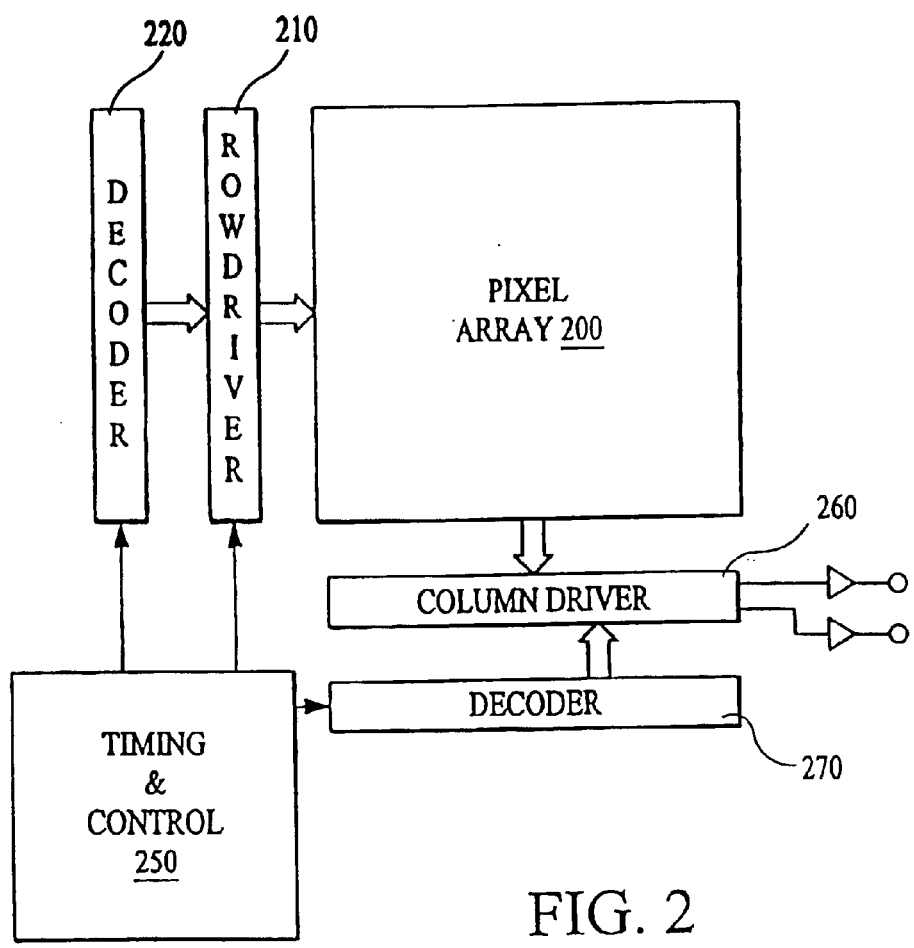
FIG. 2 is a block diagram of a CMOS active pixel sensor chip.
Figure 3:
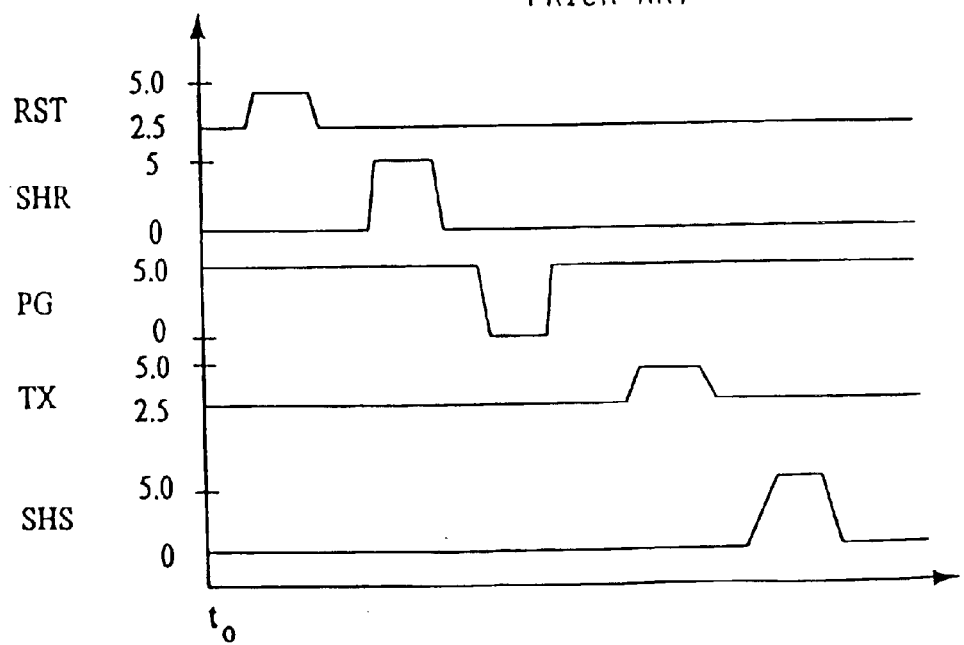
FIG. 3 is a representative timing diagram for the CMOS imager.
Figure 4:
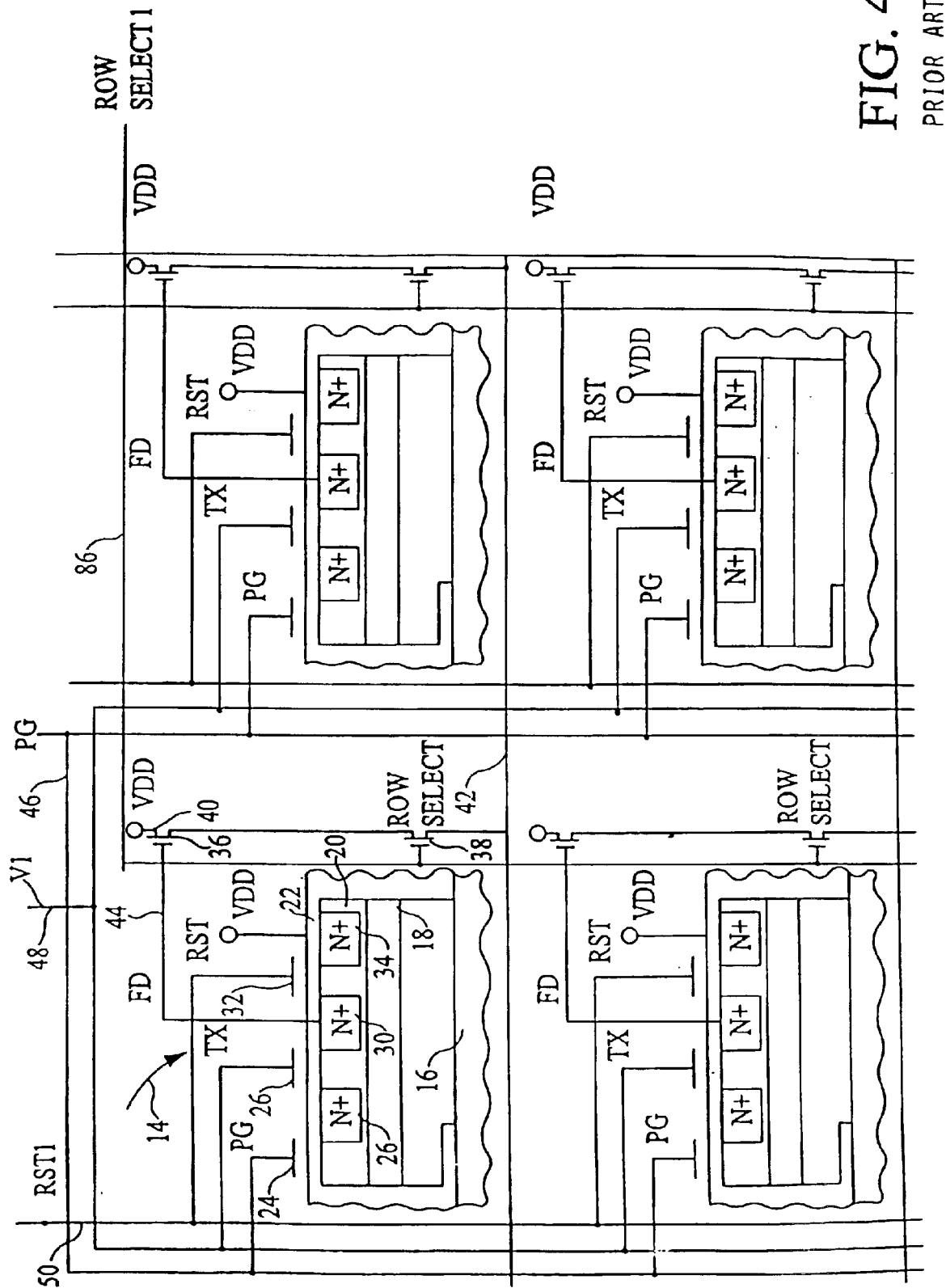
FIG. 4 is a representative pixel layout showing a 2×2 pixel layout according to one embodiment of the present invention.
Figure 5:
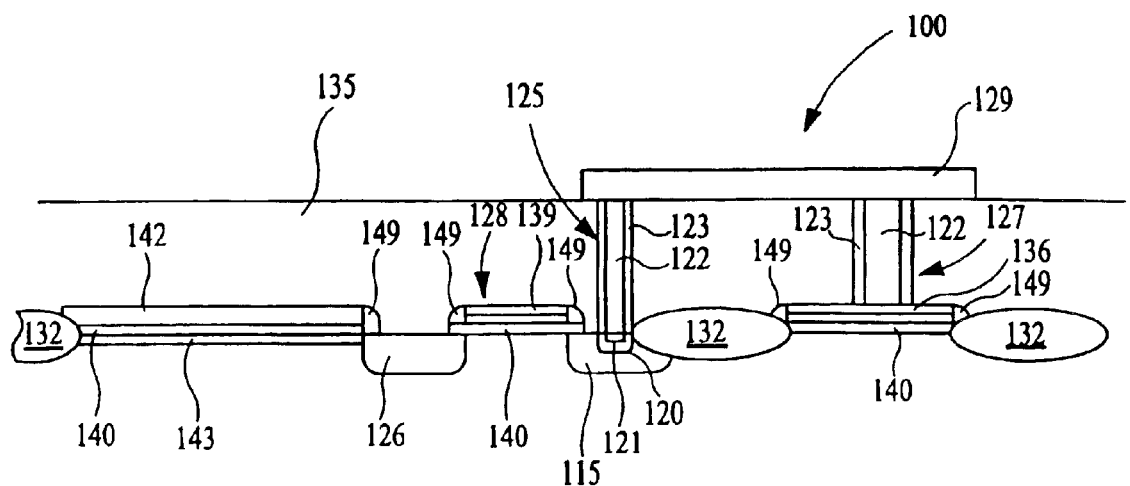
FIG. 5 is a partially cut away side view of a semiconductor imager having a photogate and a transfer gate according to the prior art.
Figure 6:
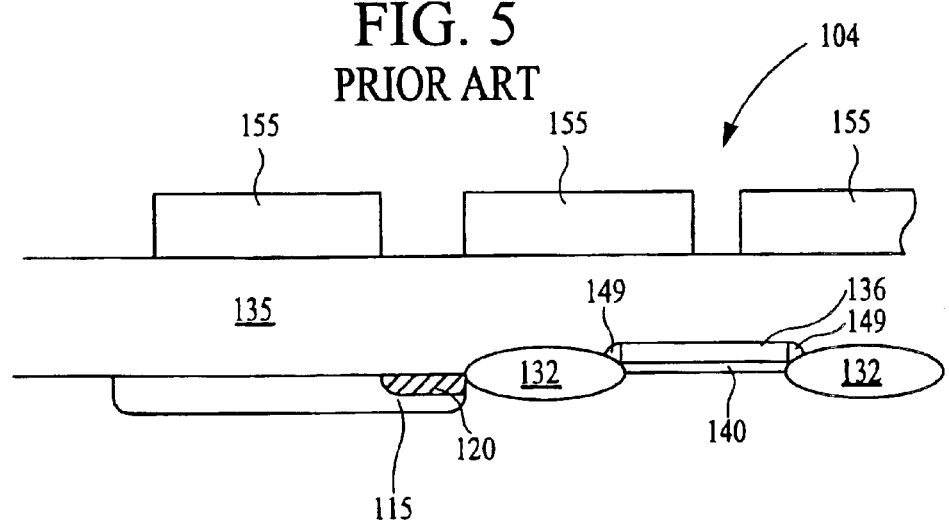
FIG. 6 shows a partially cut away side view of a semiconductor imager undergoing a processing method according to the prior art.
Figure 7:
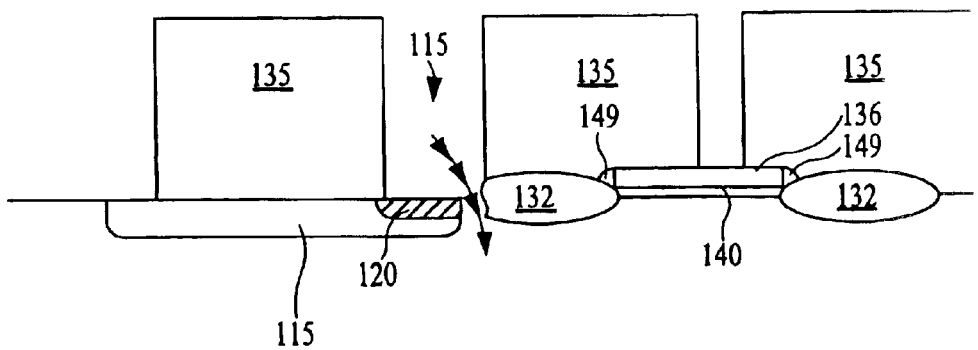
FIG. 7 shows a partially cut away side view of a semiconductor imager undergoing a processing method according to the prior art subsequent to FIG. 6.
Figure 8:
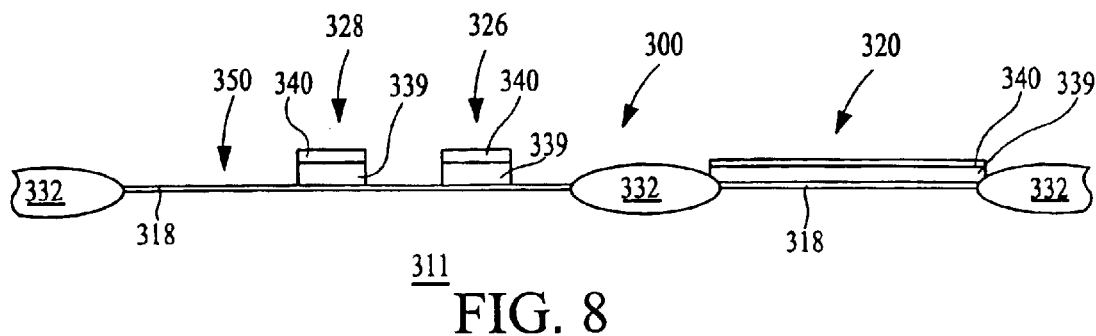
FIG. 8 shows a partially cut away side view of a semiconductor imager of a first embodiment of the present invention at an intermediate step of processing.

The invention is now described with reference to FIGS. 8–15. FIG. 8 shows a partially cut away cross-sectional view of a CMOS semiconductor wafer similar to that shown in FIG. 1. It should be understood that similar reference numbers correspond to similar elements for FIGS. 8–15. FIG. 8 shows the region between the floating diffusion and the source follower transistor for an imager having a photodiode as the photosensitive area and which includes a transfer gate 328. As with FIG. 5 above, the source follower transistor source and drain regions are in a plane perpendicular to FIG. 8.

The pixel cell 300 includes a substrate which includes a p-type well 311 formed in a substrate. It should be understood that the CMOS imager of the present invention can also be fabricated using p-doped regions in an n-well. The pixel cell 300 also includes a field oxide region 332, which serves to surround and isolate the cells. The field oxide region 332 may be formed by thermal oxidation of the substrate using the LOCOS process or by the STI process which involves the chemical vapor deposition of an oxide material.

The pixel cell 300 includes an oxide or other insulating film 318 deposited on the substrate by conventional methods. Preferably the oxide film 318 is formed of a silicon dioxide grown onto the substrate.

A transfer transistor 328 is formed by depositing a conductive gate layer 339 and an insulating layer 340 over the insulating layer 318 as shown in FIG. 8. A source follower transistor gate 320, and a reset transistor gate 326 are also formed over the insulating layer 318 at this stage of processing. The gate layers 339 of the transistors are preferably formed of doped polysilicon formed by physical deposition methods such as chemical vapor deposition (CVD) or physical vapor deposition. The gate layers 339 may also be formed of a composite layered structure of doped polysilicon/refractory metal silicide or barrier metal, if desired, according to conventional methods. Preferably the refractory metal silicide is a tungsten, titanium, tantalum or cobalt silicide. The barrier metal may be those such as titanium nitride, tungsten nitride or the like.

The insulating layer 340 formed on the gates of each of the transfer, reset and source follower transistors may be a nitride, an oxide or a combination thereof, such as, for example, an oxide/nitride/oxide (ONO) layer, an oxide/nitride (ON) layer or a nitride/oxide layer (NO). Most preferably the insulating layer 340 is an ON layer. The insulating layers 340 may be formed by CVD.

Figure 9:
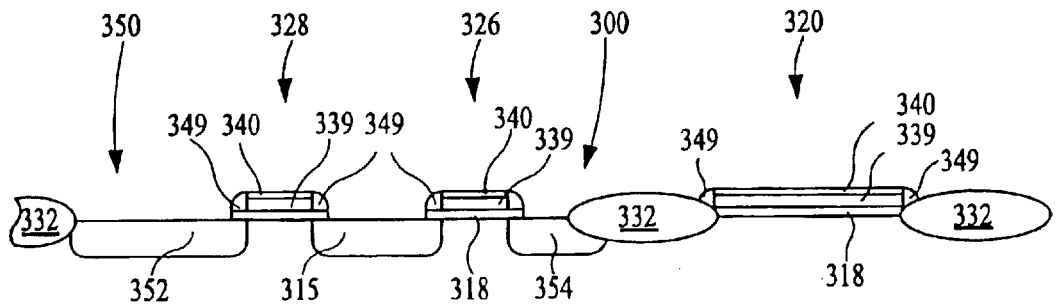
FIG. 9 shows a partially cut away side view of a semiconductor imager of the present invention subsequent to FIG. 8.

The transfer gate 328, the source follower gate 320, and the reset gate 326 have sidewall insulating spacers 349 formed on the sides of the transistor gates 339, 320, 326 as shown in FIG. 9. The spacers may be formed out of oxide or nitride or oxynitride. An n-doped region 315 is formed in p-well 311 by ion implantation and n-doped region 352 is also formed in p-well 311 by ion implantation in the area that will later become the photodiode 350 as shown in FIG. 9.

N-doped region 354 is also provided in p-well 311 in the area that will later become the reset drain for the CMOS imager. It should be understood that the regions 315, 352 and 354 may be doped to the same or differing dopant concentration levels. Additionally, while two separate doped regions are shown in the figure, a single doped region could be formed to incorporate both regions 315 and 352 if the transfer transistor is omitted. There may be other dopant implantations applied to the wafer at this stage of processing such as n-well and p-well implants or transistor voltage adjusting implants. For simplicity, these other implants are not shown in the figure.

Figure 10:
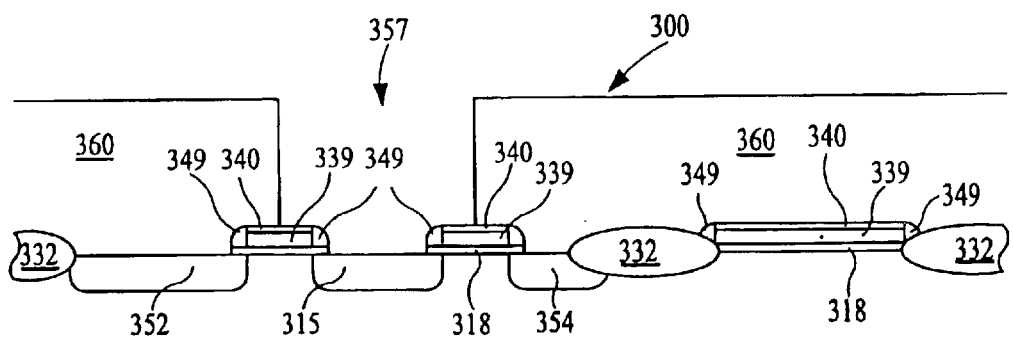
FIG. 10 shows a partially cut away side view of a semiconductor imager of the present invention subsequent to FIG. 9.

Reference is now made to FIG. 10. A layer 360 of borophosphorosilicate glass (BPSG), phososilicate glass (PSG), borosilicate glass (BSG), undoped $SiO_2$ or the like is deposited over the substrate and preferably planarized by CMP or other methods. A resist and mask (not shown) is applied to the layer 360 and the resist is developed and the layer 360 is etched to create the opening 357. The layer 360 may be etched by any conventional methods such as a selective wet etch or a selective dry etch to form opening 357. The dry etch conditions and the insulating cap composition and the spacer composition are selected so that the dry or wet etch will etch the layer 360 but not the insulating cap 340 or the spacer 349. A selective etch to etch BPSG layer 360 and not etch nitride spacers 349 would typically be conducted by photomasking and dry chemical etching of BPSG selective to the nitride. An example etch chemistry would include $CHF_3$ and $O_2$ at low $O_2$ flow rate (i.e., less than 5% $O_2$ by volume in a $CHF3/O_2$ mixture), or the combination of $CF_4$, $CH_2F_2$ and $CHF_3$. See, for example, U.S. Pat. No. 5,338,700 which is herein incorporated by reference.

In order to etch BPSG layer 360 and not the other oxides, for example field oxide layer 332, the selective etching process is performed by photomasking and dry chemical etching of BPSG selective to the oxide. An example etch chemistry would include $C_2HF_5$, $CHF_3$ and $CH_2F_2$. Preferably, the oxide selective etch is performed in a LAM 9100 etching apparatus at a $C_2HF_5$, $CHF_3$ and $CH_2F_2$ ratio of 1:3:4.

Figure 11:
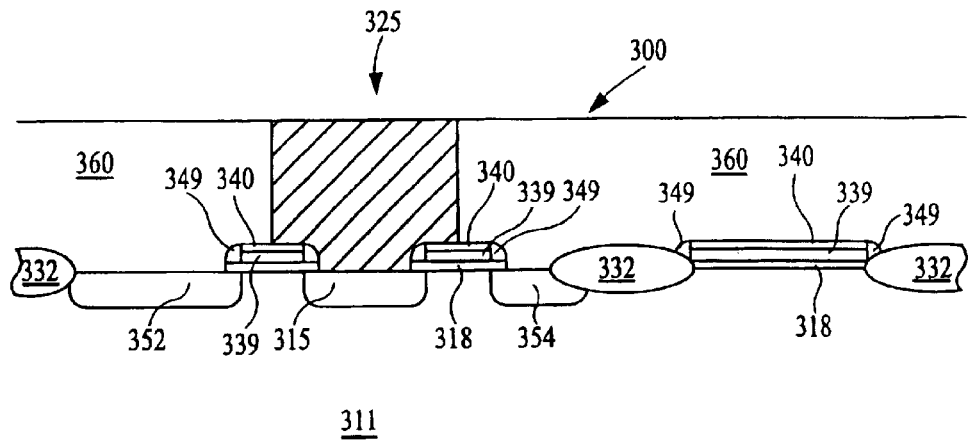
FIG. 11 shows a partially cut away side view of a semiconductor imager of the present invention subsequent to FIG. 10.

Polysilicon is then deposited by conventional methods to fill opening 357. The polysilicon is then etched back or planarized by CMP or other methods to form the self-aligned buried contact 325 in the opening 357 as shown in FIG. 11.

Figure 12:
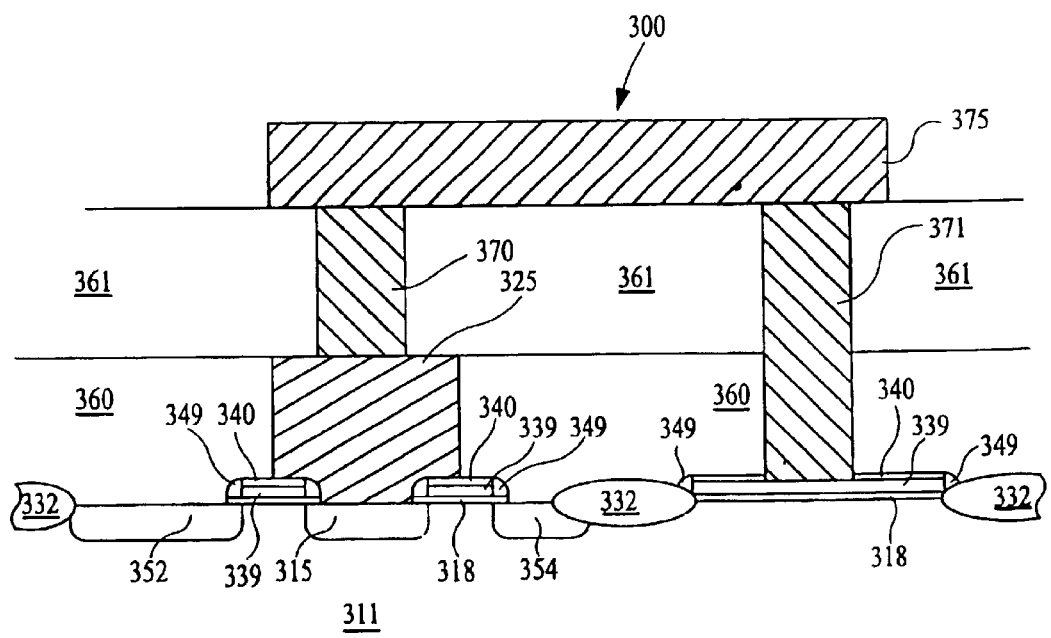
FIG. 12 shows a partially cut away side view of a semiconductor imager of the present invention subsequent to FIG. 11.

Reference is now made to FIG. 12. A layer 361 of borophosphorosilicate glass (BPSG), phosphorosilicate glass (PSG), borosilicate glass (BSG), undoped $SiO_2$ or the like is then deposited and planarized by CMP or other methods. A resist and mask (not shown) are then applied and the layer 361 is etched to form interconnects 370 and 371 over the n-type polysilicon plug 325 and the source follower transistor gate 320 respectively. The layer 361 may be etched by any conventional method such as a selective wet etch or a selective dry etch. Interconnects 370 and 371 are the same or different and may be formed of any typical interconnect conductive material such as metals or doped polysilicon. Interconnects 370 and 371 may be formed of doped polysilicon, refractory metals, such as, for example, tungsten or titanium or any other materials, such as a composite Ti/TiN/W metallization stack as is known in the art. Since the interconnect 370 connects to the self-aligned buried contact 357 through the n-type polysilicon plug 325, as opposed to floating diffusion region 315 itself, there is less concern about overetching the layer 361 to form the hole for interconnect 370 as no leakage to the substrate will result from overetching the contact hole for interconnect 370. The interconnects 370 and 371 are connected by interconnect 375 which is formed over layer 361. Interconnect 375 may also be formed of any doped polysilicon, refractory or non-refractory metals, such as, for example, tungsten or Al or Al—Cu or Cu or any other materials, such as a composite Ti/TiN/W metallization stack as is known in the art. Interconnect 375 may be formed of the same or different material as interconnects 370, 371 and may be formed at the same or different times as interconnects 370, 371.

After the processing to produce the imager shown in FIG. 12, the pixel cell 301 of the present invention is then processed according to known methods to produce an operative imaging device. The self-aligned buried contact 325 is considered buried because of additional material layers which are formed over the substrate to produce an operative CMOS imager circuit. For example, an insulating layer 361 may be applied and planarized and contact holes etched therein as shown in FIG. 12 to form conductor paths to transistor gates, etc. Conventional metal and insulation layers are formed over layer 361 and in the through holes to interconnect various parts of the circuitry in a manner similar to that used in the prior art to form gate connections. Additional insulating and passivation layers may also be applied. The imager is fabricated to arrive at an operational apparatus that functions similar to the imager depicted in FIGS. 1–4. The self-aligned buried contact 325 is buried well below the normal metal layers which are applied over layer 361 and which are used to interconnect the IC circuitry to produce a CMOS imager.

The self-aligned buried contact 325 between the floating diffusion region 315 and the source follower transistor gate 320 via interconnection lines 370, 375, 371 provides a good contact between the floating diffusion region 315 and the source follower transistor gate 320 without using processing techniques which might cause charge leakage to the substrate during device operation. The self-aligned buried contact 325 also allows the transfer and reset transistors to be placed closer together adjacent to the floating diffusion region 315 thereby allowing for an increased photosensitive area on the pixel and a reduced floating diffusion region which reduces the leakage of charge to substrate when the floating diffusion is charged and which increases the signal to noise ratio of the imager.

Figure 13:
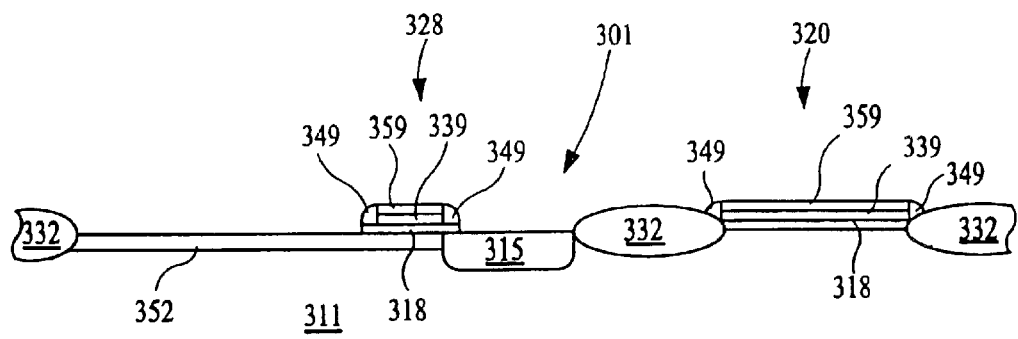
FIG. 13 shows a partially cut away side view of a semiconductor imager of another embodiment at an intermediate step of processing.
Figure 14:
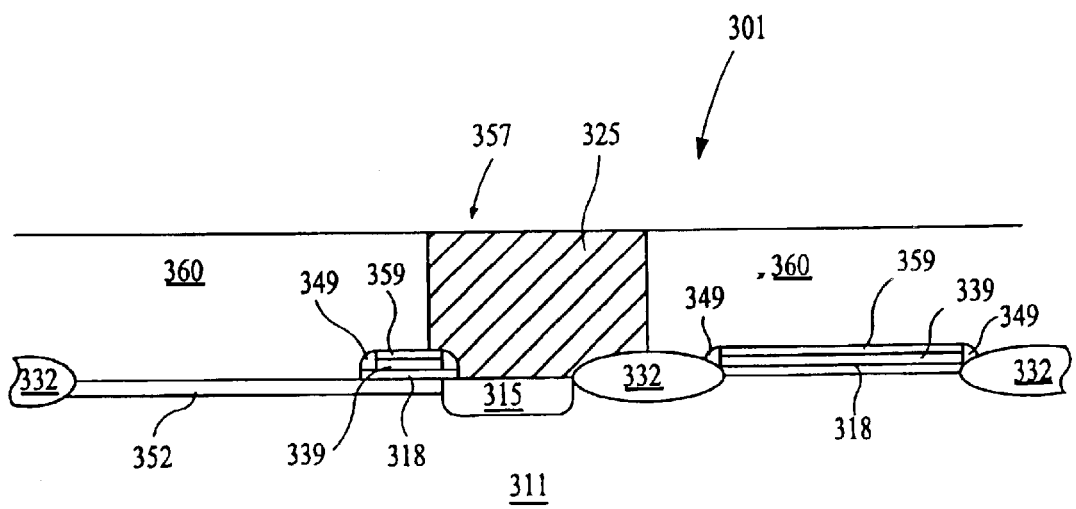
FIG. 14 shows a partially cut away side view of a semiconductor imager of the present invention subsequent to FIG. 13.
Figure 15:
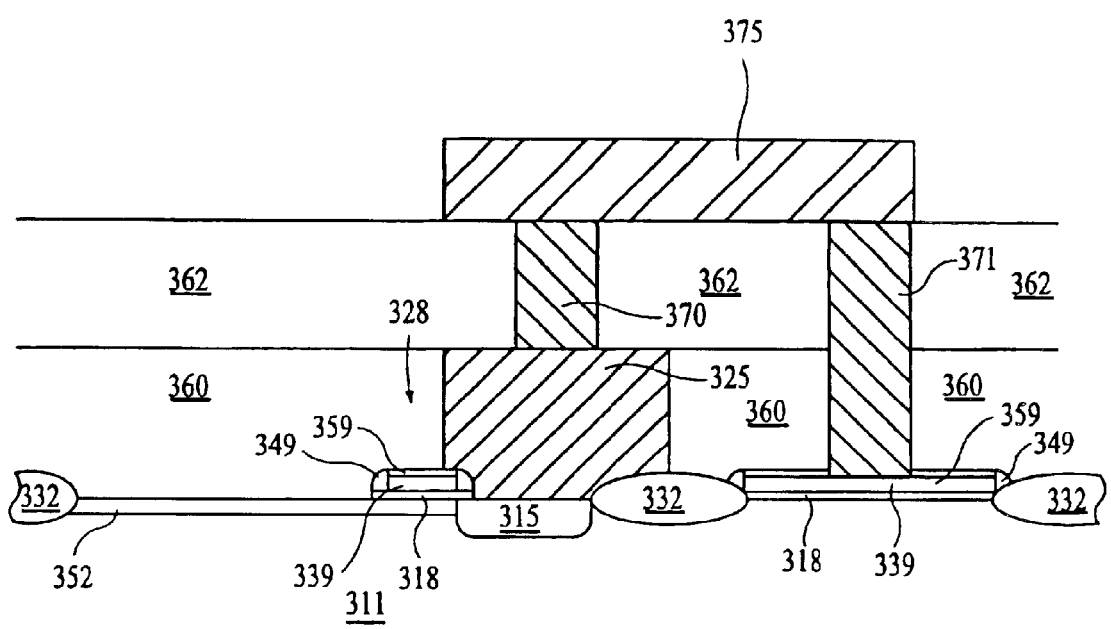
FIG. 15 shows a partially cut away side view of a semiconductor imager of the present invention subsequent to FIG. 14.

Reference is now made to FIGS. 13–15. FIG. 13 illustrates a partially cut away side view of a semiconductor imager undergoing a processing method according to the present invention. This figure shows a partially cut away semiconductor imager similar to that shown in FIGS. 8–12. The imager as illustrated in FIGS. 13–15 is fabricated in a similar fashion to that described above with reference to FIGS. 8–12. It should be understood that like reference numerals designate like elements.

The pixel cell 301 includes a substrate which includes a p-type well 311 formed in a substrate. The pixel cell 301 includes an n-doped region 315 which forms the floating diffusion region. It should be understood that the CMOS imager of the present invention can also be fabricated using p-doped regions in an n-well.

The pixel cell 301 also includes a field oxide region 332, which serves to surround and isolate the cells which may be formed by thermal oxidation of the substrate using the LOCOS process or by the STI process which involve the chemical vapor deposition of an oxide material. The field oxide region 332 forms an isolation region around the source follower transistor area 330.

The pixel cell 301 includes an oxide or other insulating film 318 deposited on the substrate by conventional methods. Preferably the oxide film 318 is formed of a silicon dioxide grown onto the substrate. A transfer transistor 328 is formed by depositing a gate conductor layer 339 and a protective insulating layer 359 over the insulating layer 318 and patterning and etching the gate conductor/gate insulator layers simultaneously as shown in FIG. 13. A source follower transistor gate 320 is similarly formed over the insulating layer 318 at this stage of processing. The gate conductor 339 is formed of doped polysilicon formed by physical deposition methods such as chemical vapor deposition (CVD) or physical vapor deposition. The gate conductor 339 may also be formed of a composite layered structure of doped polysilicon/barrier/metal for improved conductivity, if desired, according to conventional methods. Preferably the refractory metal silicide is a tungsten, titanium or cobalt silicide. The barrier can be, for example, titanium nitride or tungsten nitride. The metal can be, for example, a refractory metal such as tungsten. Preferably the protective layer 359 is a nitride or an oxide or a combination thereof, such as an oxide/nitride/oxide (ONO) layer, an oxide/nitride (ON) layer or a nitride/oxide layer (NO). Most preferably the protective layer 359 is an ONO layer. The protective layer may be formed over the gate conductive layer 339 by CVD. The transfer transistor 328 and the source follower transistor 320 have sidewall insulating spacers 349 as shown in FIG. 13. The sidewall spacers 349 may be formed out of oxide, nitride or oxynitride.

An n-doped region 315 is provided in p-well 311 as shown in FIG. 13. A doped region 352 is also formed in the substrate as shown in FIG. 13 in the area that will later become the photodiode 350. It should be understood that the regions 315 and 352 may be doped to the same or different dopant concentration levels. Additionally, while two separate doped regions are shown in the figure, a single doped region could be formed to incorporate both regions 315 and 352. There may be other dopant implantations applied to the wafer at this stage of processing such as n-well and p-well implants or transistor voltage adjusting implants. For simplicity, these other implants are not shown in the figure.

Reference is made to FIG. 14. A layer 360 of borophosphosilicate glass (BPSG), phosphorosilicate glass (PSG), borosilicate glass (BSG), undoped $SiO_2$ or the like is deposited over the substrate p-well 311. A resist and mask (not shown) is applied to the layer 360 and the resist is developed and the layer 360 is etched to create the opening 357. The layer 360 may be etched by a selective wet etch or a selective dry etch to form opening 357. A selective etch to etch BPSG layer 360 and not etch nitride spacers 349 or protective layer 359 would typically be conducted by photomasking and dry chemical etching of BPSG selective to the nitride. An example etch chemistry would include $CHF_3$ and $O_2$ at low $O_2$ flow rate (i.e., less than 5% $O_2$ by volume in a $CHF_3/O_2$ mixture), or the combination of $CF_4$, $CH_2F_2$ and $CHF_3$. See, U.S. Pat. No. 5,338,700 which is herein incorporated by reference.

In order to etch BPSG layer 360 and not the other oxides, for example field oxide layer 332, the selective etching process is performed by photomasking and dry chemical etching of BPSG selective to the oxide. An example etch chemistry would include $C_2HF_5$, $CHF_3$ and $CH_2F_2$. Preferably, the oxide selective etch is perfumed in a LAM 9100 etching apparatus at a $C_2HF_5$, $CHF_3$ and $CH_2F_2$ ratio of 1:3:4.

The self-aligned buried contact 325 is then formed in the opening 357 in the layer 360. The self-aligned buried contact 325 may be formed by conventional methods. Preferably the self-aligned buried contact 325 is formed by chemical vapor deposition of doped polysilicon with a following polysilicon dry or wet etchback or a polysilicon CMP to leave the polysilicon only in the opening 357.

Reference is now made to FIG. 15. The layer 362 is then deposited and planarized by CMP or other methods. A resist (not shown) is then applied, openings are patterned using photolithography, and the layers 360, 362, and 359 are etched to form interconnects 370 and 371 over the self-aligned buried contact 325 and the source follower transistor gate 320 respectively. The layers 359, 360, 362 may be etched by any conventional method such as a selective wet etch or a selective dry etch. Interconnects 370 and 371 may be formed, the same or differently, of any typical interconnect conductive material such as metals or doped polysilicon. Interconnects 370 and 371 may be formed of doped polysilicon, refractory metals, such as, for example, tungsten or titanium or any other materials, such as a composite Ti/TiN/W metallization stack as is known in the art. Since the interconnect 370 connects to the self-aligned buried contact 325, as opposed to floating diffusion region 315 itself, there is less concern about overetching the layers 360 and 362 to form the hole for interconnect 370 as no leakage to the substrate will result from overetching the contact hole for interconnect 370. The interconnects 370 and 371 are connected by interconnect 375 which is formed over layer 362. Interconnect 375 may also be formed of any doped polysilicon, refractory metals, such as, for example, tungsten, copper, aluminum, an aluminum-copper alloy or any other materials, such as a composite Ti/TiN/W metallization stack as is known in the art. Interconnect 375 may be formed of the same or different material as interconnects 370, 371 and may be formed at the same or different times as interconnects 370, 371.

After the processing to produce the imager shown in FIG. 15, the pixel cell 301 of the present invention is then processed according to known methods to produce an operative imaging device. The self-aligned buried contact 325 is considered buried because of additional material layers which are formed over the substrate to produce an operative CMOS imager circuit. For example, an insulating layer 362 may be applied and planarized and contact holes etched therein as shown in to form conductor paths to transistor gates, etc. Conventional metal and insulation layers are formed over layer 362 to interconnect various parts of the circuitry in a manner similar to that used in the prior art to form gate connections. Additional insulating and passivation layers may also be applied. The imager is fabricated to arrive at an operational apparatus that functions similar to the imager depicted in FIGS. 1–4. The self-aligned buried contact 325 is buried well below the normal metal layers which are applied over layer 362 and which are used to interconnect the IC circuitry to produce a CMOS imager.

The self-aligned buried contact 325 between the floating diffusion region 315 and the source follower transistor gate 320 via interconnection lines 370, 375, 371 provides a good contact between the floating diffusion region 315 and the source follower transistor gate 320 without using processing techniques which might cause charge leakage to the substrate during device operation. The self-aligned buried contact 325 also allows the source follower transistor to be placed closer to the floating diffusion region 315 thereby allowing for an increased photosensitive area on the pixel and a short conductor length between the floating diffusion region and gate of the source follower transistor which increases the signal to noise ratio of the imager.

The pixel arrays of the present invention described with reference to FIGS. 8–15 may be further processed as known in the art to arrive at CMOS imagers representative of those discussed above with reference to FIGS. 1–4 and having the buried conductor of the present invention.

Figure 16:
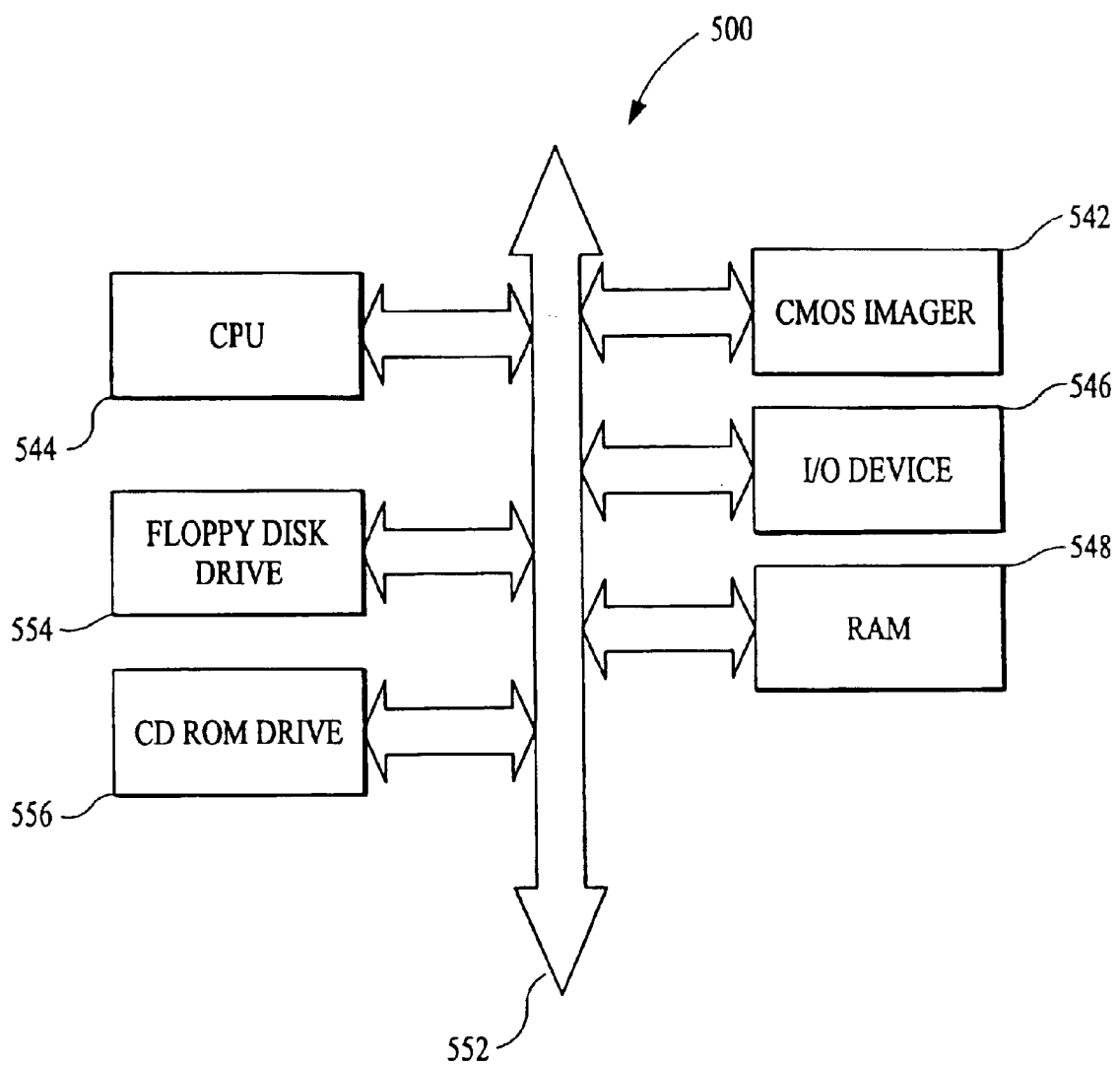
FIG. 16 is an illustration of a computer system having a CMOS imager according to the present invention.

A typical processor based system which includes a CMOS imager device according to the present invention is illustrated generally at 500 in FIG. 16. A processor based system is exemplary of a system having digital circuits which could include CMOS imager devices. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 544, for example, a microprocessor, that communicates with an input/output (I/O) device 546 over a bus 552. The CMOS imager 542 also communicates with the system over bus 452. The computer system 500 also includes random access memory (RAM) 548, and, in the case of a computer system may include peripheral devices such as a floppy disk drive 554 and a compact disk (CD) ROM drive 556 which also communicate with CPU 544 over the bus 552. CMOS imager 542 is preferably constructed as an integrated circuit which includes the CMOS imager having a buried contact line between the floating diffusion region and the source follower transistor, as previously described with respect to FIGS. 8–17. It may also be desirable to integrate the processor 554, CMOS imager 542 and memory 548 on a single IC chip.

It should again be noted that although the invention has been described with specific reference to CMOS imaging circuits having a photogate and a floating diffusion, the invention has broader applicability and may be used in any CMOS imaging apparatus. For example, the CMOS imager array can be formed on a single chip together with the logic or the logic and array may be formed on separate IC chips. Additionally, while the figures describe the invention with respect to a photodiode type of CMOS imager, any type of photocollection devices such as photogates, photoconductors or the like may find use in the present invention. Similarly, the process described above is but one method of many that could be used. Additionally, although the invention is described with respect to forming the self-aligned buried contact 325 between a transfer gate 328 and a reset gate 326, it should be understood that the self-aligned buried contact 325 may be formed between any two transistor gates. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. An imaging device comprising:
   a substrate;
   a photosensitive area within said substrate for accumulating photo-generated charge in said photosensitive area;
   a floating diffusion region in said substrate for receiving photo-generated charge from said photosensitive area;
   a readout circuit comprising at least an output transistor formed in said substrate; and,
   a buried contact for interconnecting said floating diffusion region with said output transistor.

2. The imaging device according to claim 1, wherein the accumulation of charge in said photosensitive area is conducted by a photoconductor.

3. The imaging device according to claim 1, wherein the accumulation of charge in said photosensitive area is controlled by a photogate.

4. The imaging device according to claim 1, wherein said photosensitive area is a photodiode.

5. The imaging device according to claim 1, further including a charge transfer region between said photosensitive area and said floating diffusion region, said charge transfer region including a field effect transistor, wherein said buried contact is aligned to a gate structure of said field effect transistor.

6. The imaging device according to claim 5, wherein said output transistor is a source follower transistor and wherein said buried contact connects said floating diffusion region and said source follower transistor via interconnectors.

7. The imaging device according to claim 6, wherein said interconnectors are formed at least in part of doped polysilicon.

8. The imaging device according to claim 6, wherein said interconnectors are formed of at least one refractory metal.

9. The imaging device according to claim 8, wherein said refractory metal is tungsten.

10. The imaging device according to claim 6, wherein said interconnectors are formed of aluminum-copper alloy.

11. The imaging device according to claim 6, wherein said interconnectors are formed of copper.

12. The imaging device according to claim 8, wherein said refractory metal is titanium.

13. The imaging device according to claim 6 wherein the accumulation of charge in said photosensitive area is conducted by a photoconductor.

14. The imaging device according to claim 6, wherein the accumulation of charge in said photosensitive area is conducted by a photogate.

15. The imaging device according to claim 6, wherein said photosensitive area is a photodiode.

16. The imaging device according to claim 5, further comprising an insulating layer formed over the gate of said transfer transistor and said source follower transistor and under the buried contact.

17. The imaging device according to claim 16, wherein said insulating layer includes a nitride.

18. The imaging device according to claim 16, wherein said insulating layer includes an oxide.

19. The imaging device according to claim 17, wherein said insulating layer is a nitride, ONO, NO, ON, or combinations thereof.

20. An imaging device comprising
   a semiconductor integrated circuit substrate;
   a photosensitive device formed on said substrate for accumulating photo-generated charge in an underlying region of said substrate;
   a floating diffusion region in said substrate for receiving said photo-generated charge;
   a readout circuit comprising at least an output transistor formed in said substrate; and
   said floating diffusion region being connected to said output by a buried contact via interconnectors.

21. The imaging device according to claim 20, wherein said photosensitive device is a photogate.

22. The imaging device according to claim 20, wherein said photosensitive device is a photodiode.

23. The imaging device according to claim 20, wherein said photosensitive device is a photoconductor.

24. The imaging device according to claim 20, further including a charge transfer region between said photosensitive area and said floating diffusion region, said charge transfer region including a field effect transistor, wherein said buried contact is aligned to said field effect transistor.

25. The imaging device according to claim 24, wherein said output transistor is a source follower transistor and wherein said buried contact contacts said floating diffusion region and said source follower transistor via interconnectors.

26. The imaging device according to claim 25, wherein said interconnectors are formed at least in part of doped polysilicon.

27. The imaging device according to claim 25, wherein said interconnectors are formed of at least one refractory metal.

28. The imaging device according to claim 25, wherein said interconnectors are formed of aluminum-copper alloy.

29. The imaging device according to claim 25, wherein said interconnectors are formed of copper.

30. The imaging device according to claim 27, wherein said refractory metal is tungsten.

31. The imaging device according to claim 27, wherein said refractory metal is titanium.

32. The imaging device according to claim 24, wherein the accumulation of charge in said photosensitive area is conducted by a photoconductor.

33. The imaging device according to claim 24, wherein the accumulation of charge in said photosensitive area is conducted by a photogate.

34. The imaging device according to claim 24, wherein said photosensitive area is a photodiode.

35. The imaging device according to claim 20, wherein said output transistor is formed adjacent to said floating diffusion region on said substrate.

36. The imaging device according to claim 20, further comprising a reset transistor for resetting said floating diffusion region to a predetermined voltage.

37. The imaging device according to claim 20, wherein said floating diffusion region is an n-doped region in a p-well.

38. The imaging device according to claim 33, wherein said photogate is formed of doped polysilicon.

39. The imaging device according to claim 34, further comprising a lightly n-doped region beneath said photodiode.

40. The imaging device according to claim 21, further comprising an insulating layer formed over the gate of said transfer transistor and said source follower transistor and under the buried contact.

41. The imaging device according to claim 40, wherein said insulating layer includes a nitride.

42. The imaging device according to claim 40, wherein said insulating layer includes an oxide.

43. The imaging device according to claim 41, wherein said insulating layer is selected from the group consisting of a nitride, ONO, NO, ON, and combinations thereof.

44. A processing system comprising:
(i) a processor; and
(ii) a CMOS imaging device coupled to said processor and including:
a substrate;
a photosensitive area within said substrate for accumulating photo-generated charge in said photosensitive area;
a floating diffusion region in said substrate for receiving photo-generated charge from said photosensitive area;
a readout circuit comprising at least an output transistor formed in said substrate; and,
a buried contact for interconnecting said floating diffusion region with said output transistor.

45. The system according to claim 44, wherein the accumulation of charge in said photosensitive area is conducted by a photoconductor.

46. The system according to claim 44, wherein the accumulation of charge in said photosensitive area is controlled by a photogate.

47. The system according to claim 44, wherein said photosensitive area is a photodiode.

48. The system according to claim 44, further including a charge transfer region between said photosensitive area and said floating diffusion region, said charge transfer region including a field effect transistor, wherein said buried contact is aligned to said field effect transistor.

49. The system according to claim 48, wherein said output transistor is a source follower transistor and wherein said buried contact contacts said floating diffusion region and said source follower transistor via interconnectors.

50. The system according to claim 49, wherein said interconnectors are formed at least in part of doped polysilicon.

51. The system according to claim 49, wherein said interconnectors are formed of at least one refractory metal.

52. The system according to claim 49, wherein said interconnectors are formed of aluminum copper alloy.

53. The system according to claim 49, wherein said interconnectors are formed of copper.

54. The system according to claim 51, wherein said refractory metal is tungsten.

55. The system according to claim 51, wherein said refractory metal is titanium.

56. The system according to claim 48, wherein the accumulation of charge in said photosensitive area is conducted by a photoconductor.

57. The system according to claim 48, wherein the accumulation of charge in said photosensitive area is conducted by a photogate.

58. The system according to claim 48, wherein said photosensitive area is a photodiode.

59. The system according to claim 48, further comprising an insulating layer formed over the gate of said transfer transistor and said source follower transistor and under the buried contact.

60. The system according to claim 59, wherein said insulating layer includes a nitride.

61. The system according to claim 59, wherein said insulating layer includes an oxide.

62. The system according to claim 60, wherein said insulating layer is a nitride, ONO, NO, ON, or combinations thereof.

63. An imaging device comprising:
a substrate;
a photosensitive area within said substrate for accumulating photo-generated charge in said photosensitive area;
a readout circuit comprising at least an output transistor formed in said substrate; and,
a buried contact formed over a doped region in said substrate and between two structures on said substrate for electrically connecting said imaging device, wherein said structures are selected from a transistor gate and an isolation region.

64. The imaging device according to claim 63, wherein the accumulation of charge in said photosensitive area is conducted by a photoconductor.

65. The imaging device according to claim 63, wherein the accumulation of charge in said photosensitive area is controlled by a photogate.

66. The imaging device according to claim 63, wherein said photosensitive area is a photodiode.

67. The imaging device according to claim 63, further including a charge transfer transistor and a reset transistor, wherein said buried contact is aligned between said transfer transistor and said reset transistor.

68. The imaging device according to claim 67, wherein said buried contact electrically connects said imaging device via interconnectors.

69. The imaging device according to claim 67, wherein said interconnectors are formed at least in part of doped polysilicon.

70. The imaging device according to claim 67, wherein said interconnectors are formed of at least one refractory metal.

71. The imaging device according to claim 68, wherein said interconnectors are formed of an aluminum-copper alloy.

72. The imaging device according to claim 68, wherein said interconnectors are formed of copper.

73. The imaging device according to claim 70, wherein said refractory metal is tungsten.

74. The imaging device according to claim 70, wherein said refractory metal is titanium.

75. The imaging device according to claim 63, wherein said buried contact is formed between two transistor gates.

76. The imaging device according to claim 63, wherein said buried contact is formed between two isolation regions.

77. The imaging device according to claim 63, wherein said buried contact is formed between a transistor gate and an isolation region.

78. The imaging device according to claim 75, further comprising an insulating layer formed over the gate of said transistors and under the buried contact.

79. The imaging device according to claim 78, wherein said insulating layer includes a nitride.

80. The imaging device according to claim 78, wherein said insulating layer includes an oxide.

81. The imaging device according to claim 68, wherein said insulating layer is a nitride, ONO, NO, ON, or combinations thereof.

82. The imaging device according to claim 74, wherein said isolation region is a field oxide region.

83. The imaging device according to claim 63, wherein said substrate is a semiconductor integrated circuit substrate.

84. A processing system comprising:
(i) a processor; and
(ii) a CMOS imaging device coupled to said processor and including:
a substrate;
a photosensitive area within said substrate for accumulating photo-generated charge in said photosensitive area;
a readout circuit comprising at least an output transistor formed on said substrate; and,
a buried contact formed over a doped region in said substrate and between two structures on said substrate electrically connecting said imaging device, wherein said structures are selected from a transistor gate and an isolation region.

85. The system according to claim 84, wherein the accumulation of charge in said photosensitive area is conducted by a photoconductor.

86. The system according to claim 84, wherein the accumulation of charge in said photosensitive area is controlled by a photogate.

87. The system according to claim 84, wherein said photosensitive area is a photodiode.

88. The system according to claim 84, further including a charge transfer transistor and a reset transistor, wherein said buried contact is aligned between the gates of said charge transfer transistor and said reset transistor.

89. The system according to claim 88, wherein said buried contact electrically connects said imaging device via interconnectors.

90. The system according to claim 89, wherein said interconnectors are formed at least in part of doped polysilicon.

91. The system according to claim 89, wherein said interconnectors are formed of at least one refractory metal.

92. The system according to claim 91, wherein said refractory metal is tungsten.

93. The system according to claim 91, wherein said refractory metal is titanium.

94. The system according to claim 84, wherein said buried contact is formed between two transistor gates.

95. The system according to claim 84, wherein said buried contact is formed between two isolation regions.

96. The system according to claim 84, wherein said buried contact is formed between a transistor gate and an isolation region.

97. The system according to claim 84, further comprising an insulating layer formed over the gate of said transistors and under the buried contact.

98. The system according to claim 97, wherein said insulating layer includes a nitride.

99. The system according to claim 97, wherein said insulating layer includes an oxide.

100. The system according to claim 97, wherein said insulating layer is a nitride, ONO, NO, ON, or combinations thereof.

101. The system according to claim 95, wherein said isolation region is a field oxide region.

102. The system according to claim 84, wherein said substrate is a semiconductor integrated circuit substrate.

* * * * *